United States Patent
Sheng et al.

(10) Patent No.: US 7,307,476 B2
(45) Date of Patent: Dec. 11, 2007

(54) METHOD FOR NULLIFYING TEMPERATURE DEPENDENCE AND CIRCUIT THEREFOR

(75) Inventors: Senpeng Sheng, Chandler, AZ (US); John D. Stone, Mesa, AZ (US)

(73) Assignee: Semiconductor Components Industries, L.L.C., Phoenix, AZ (US)

(*) Notice: Subject to any disclaimer, the term of this patent is extended or adjusted under 35 U.S.C. 154(b) by 107 days.

(21) Appl. No.: 11/357,878

(22) Filed: Feb. 17, 2006

(65) Prior Publication Data

US 2007/0194849 A1   Aug. 23, 2007

(51) Int. Cl.
*H03F 3/45* (2006.01)

(52) U.S. Cl. ........................ 330/256; 330/289

(58) Field of Classification Search ............... 330/256, 330/289, 285, 296, 261
See application file for complete search history.

(56) References Cited

U.S. PATENT DOCUMENTS

| | | | |
|---|---|---|---|
| 4,072,870 A | 2/1978 | Davis | |
| 4,320,347 A * | 3/1982 | Haque | 330/9 |
| 4,673,867 A | 6/1987 | Davis | |
| 4,933,643 A * | 6/1990 | Jandu et al. | 330/9 |
| 5,177,376 A | 1/1993 | Wellnitz et al. | |
| 5,313,114 A | 5/1994 | Poletto et al. | |
| 5,362,994 A | 11/1994 | Lin | |
| 5,646,518 A * | 7/1997 | Lakshmikumar et al. | 323/316 |
| 5,894,234 A | 4/1999 | Morris | |
| 6,906,568 B2 | 6/2005 | Lin et al. | |

* cited by examiner

*Primary Examiner*—Henry Choe
(74) *Attorney, Agent, or Firm*—Rennie W. Dover

(57) ABSTRACT

A circuit and a method for nullifying temperature dependence of a circuit characteristic. The circuit includes a plurality of transistors configured such that they generate a gate voltage that includes a threshold voltage as a component. The gate voltage is applied to a transistor to generate a current that is proportional to a process transconductance parameter. The current is applied to a comparator having a differential pair of transistors, wherein each transistor has a process transconductance parameter. The circuit takes the ratios of the process transconductance parameter associated with the current to that of each transistor of the differential pair. By rationing the process transconductance parameters, temperature dependence is nullified or negated. The ratios can be used to set the hysteresis voltage of the comparator.

21 Claims, 2 Drawing Sheets

10

100

METHOD FOR NULLIFYING TEMPERATURE DEPENDENCE AND CIRCUIT THEREFOR

FIELD OF THE INVENTION

This invention relates, in general, to circuits and, more particularly, to circuits capable of nullifying temperature dependence of characteristics associated with the circuits.

BACKGROUND OF THE INVENTION

Electronic circuits are used in a variety of applications including automotive, aviation, communications, space, military, computing, video games, etc. Because of the variety and diversity of applications in which they are used, electronic circuits encounter many different environmental conditions such as large variations in temperature and humidity. They may also encounter many different physical stresses. A drawback with large temperature variations is that circuit parameters vary with temperature. For example, the thermal voltage of an insulated gate field effect transistor decreases as temperature increases, whereas its drain current may increase or decrease as temperature increases. In many circuits, it is desirable for circuit parameters to have fixed values over temperature. Techniques for making circuits temperature independent typically include using a large number of semiconductor devices, which consumes a large area of the semiconductor substrate, a large amount of power, or a combination thereof. These techniques increase the cost and complexity of manufacturing the circuits.

Hence, there exists a need for improved electronic circuits with operating parameters that are independent of temperature. It is desirable for the electronic circuits to be cost and time efficient to manufacture.

BRIEF DESCRIPTION OF THE DRAWINGS

The present invention will be better understood from a reading of the following detailed description, taken in conjunction with the accompanying drawing figures, in which like reference characters designate like elements, and in which.

DETAILED DESCRIPTION

Generally the present invention provides a method and a circuit for generating an electrical parameter or characteristic that is independent of temperature. In accordance with one embodiment, the method nullifies or negates a temperature component by generating a current that is proportional to a process transconductance parameter and then applying the current to a circuit that also has a process transconductance parameter. The circuit ratios the process transconductance parameters to nullify the temperature components. As those skilled in the art are aware, the process transconductance parameter is the product of the average mobility of electrons in a channel of an insulated gate field effect transistor (IGFET) and the gate oxide capacitance per unit area of the IGFET. A related parameter is the device transconductance parameter which is the product of the process transconductance parameter and ratio of the channel width to the channel length. The circuit may be, for example, a comparator and the electrical parameter may be hysteresis voltage. It should be noted that the circuit is not limited to being a comparator and the electrical parameter is not limited to being hysteresis voltage. The electrical parameter may be referred to as a characteristic of the circuit. The characteristic of the circuit may be a measurable characteristic.

In accordance with another embodiment, the current is generated by applying a voltage to the gate of an insulated gate field effect transistor, wherein the voltage is substantially equal to the sum of a reference voltage and the threshold voltage or the difference of the reference voltage and the threshold voltage. One means for generating the voltage includes configuring a plurality of IGFETs such that the sum of their gate-to-source voltages leaves a threshold voltage.

Figure 1:
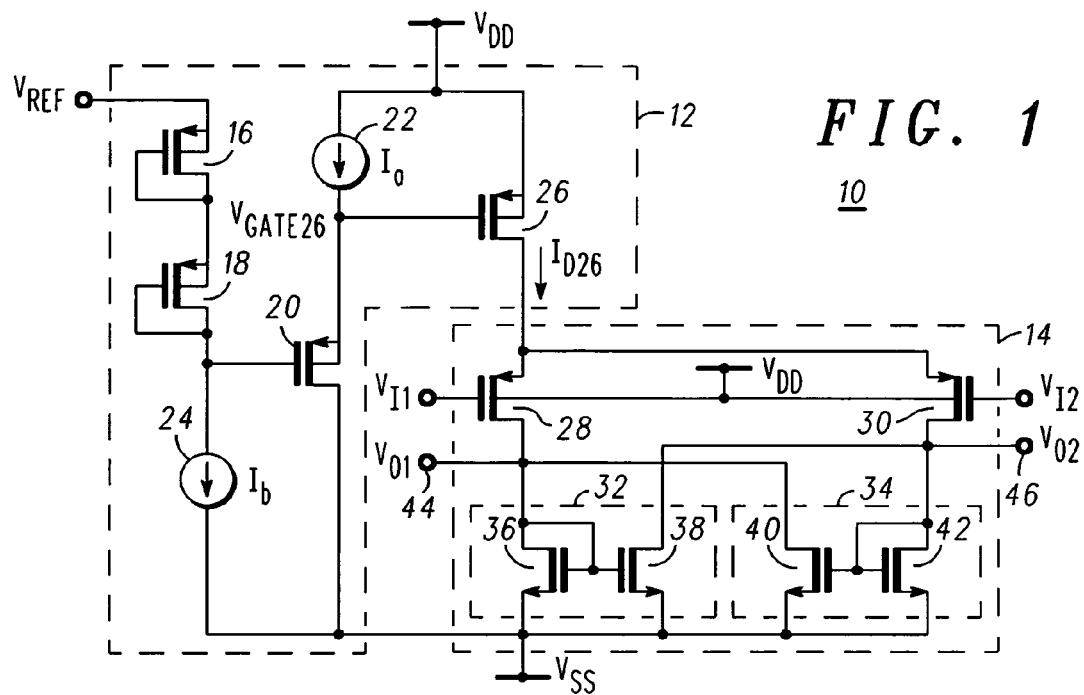
FIG. 1 is schematic diagram of an electronic circuit in accordance with an embodiment of the present invention.

FIG. 1 is a schematic diagram of an electronic circuit 10 comprising a reference generator 12 connected to a comparator 14 in accordance with an embodiment of the present invention. Reference generator 12 comprises two diode connected P-channel insulated gate field effect transistors (IGFETs) 16 and 18, a P-channel IGFET 20, a P-channel IGFET 26, and two current sources 22 and 24. More particularly, the source of IGFET 16 is coupled for receiving a reference voltage $V_{REF}$ and the gate of P-channel IGFET 16 is connected to its drain. The body of P-channel IGFET 16 is connected to its source. The drain of P-channel IGFET 16 is connected to the source of P-channel IGFET 18. The gate of P-channel IGFET 18 is connected to its drain, and the body of P-channel IGFET 18 is connected to its source. The gate of P-channel IGFET 20 is connected to the gate and to the drain of P-channel IGFET 18, the source of P-channel IGFET 20 is coupled for receiving a source of operating potential $V_{DD}$ through current source 22, and the drain of P-channel IGFET 20 is coupled for receiving a source of operating potential $V_{SS}$. The body of P-channel IGFET 20 is connected to its source. The gates of P-channel IGFETs 18 and 20 are coupled for receiving the source of operating potential $V_{SS}$ through a current source 24. P-channel IGFET 26 has a gate connected to the source of P-channel IGFET 20 and to current source 22, a source connected for receiving source of operating potential $V_{DD}$, and a body connected to its source. It should be understood that for an IGFET, the drain and source may be referred to as current carrying electrodes and the gate may be referred to as a control electrode. The body may also be referred to as a body region.

Comparator 14 comprises a pair of differentially configured P-channel IGFETs 28 and 30 and a pair of current mirrors 32 and 34. The sources of P-channel IGFETs 28 and 30 are commonly connected to each other and to the drain of P-channel IGFET 26. The gates of P-channel IGFETs 28 and 30 are coupled for receiving input signals $V_{I1}$ and $V_{I2}$, respectively. The bodies of IGFETs 28 and 30 are coupled for receiving source of operating potential $V_{DD}$.

Current mirror 32 comprises a pair of N-channel IGFETs 36 and 38 having commonly connected gates and commonly connected sources, which commonly connected sources are coupled for receiving source of operating potential $V_{SS}$. The gates of N-channel IGFETs 36 and 38 are connected to each other and to the drains of P-channel IGFET 28 and N-channel IGFET 36. The commonly connected gate and drain of N-channel IGFET 36 may be referred to as an input terminal of current mirror 32 and the drain of IGFET 38 may be referred to as a mirror or output terminal of current mirror 32. The drain of P-channel IGFET 28 is connected to the drain of N-channel IGFET 36. The commonly connected drains of IGFETs 28 and 36 serve as an output 44 of comparator 14 for outputting an output signal $V_{O1}$. The drain of N-channel transistor 38 is connected to the drains of P-channel IGFET 30 and N-channel IGFET 42.

Current mirror 34 comprises a pair of N-channel IGFETs 40 and 42 having commonly connected gates and commonly connected sources, which sources are coupled for receiving source of operating potential $V_{SS}$. The commonly connected gates of N-channel IGFETs 40 and 42 are connected to each other and to the drains of P-channel IGFET 30 and N-channel IGFET 42. The commonly connected gate and drain of N-channel IGFET 42 may be referred to as an input terminal of current mirror 34 and the drain of IGFET 40 may be referred to as a mirror or output terminal of current mirror 34. The drain of P-channel IGFET 30 is connected to the drain of N-channel IGFET 42 and serves as an output 46 of comparator 14 for outputting an output signal $V_{O2}$. The drain of N-channel transistor 40 is also connected to the drains of P-channel IGFET 28 and N-channel IGFET 36.

In operation, a reference voltage $V_{REF}$ is applied to the drain of P-channel IGFET 16 which turns on P-channel IGFETs 16 and 18. Turning on P-channel IGFETs 16 and 18 raises the voltage at the gate of P-channel IFGET 20, thereby turning it on. Turning on P-channel IGFETs 16, 18, and 20 enables current sources 22 and 24 to conduct currents $I_a$ and $I_b$, respectively. In response to P-channel IGFETs 16, 18, and 20 and current sources 22 and 24 being on, a gate voltage $V_{GATE26}$ appears at the gate of P-channel IGFET 26 which is given by Equation 1 (Eqt. 1) as:

$$V_{GATE26} = V_{REF} - V_T \qquad \text{Eqt. 1}$$

where:

$V_{REF}$ is the reference voltage applied at the source of P-channel IGFET 16; and $V_T$ is the threshold voltage of P-channel IFGETs 16, 18, or 20.

Gate voltage $V_{GATE26}$ turns on P-channel IGFET 26 such that it operates in saturation mode having a gate-to-source voltage $V_{gs26}$. Gate-to-source voltage $V_{gs26}$ is given by Equation 2 (Eqt. 2) as:

$$V_{gs26} = V_{REF} - V_T - V_{DD} \qquad \text{Eqt. 2}$$

where:

$V_{REF}$ is the reference voltage applied at the source of P-channel IGFET 16;

$V_T$ is the threshold voltage of P-channel IFGETs 16, 18, and 20; and $V_{DD}$ is a source of operating potential.

Equation 2 is derived using Kirchoff's Voltage Law and the equations for the gate-to-source voltages of P-channel IGFETs 16, 18, and 20. The gate-to-source voltages of P-channel IGFETs 16, 18, and 20 are given by Equations 3, 4, and 5, respectively.

$$V_{gs16} = -(((I_b * 2 * L_{16})/(k'^* W_{16}))^{(1/2)} + V_T) \qquad \text{Eqt. 3}$$

$$V_{gs18} = -(((I_b * 2 * L_{18})/(k'^* W_{18}))^{(1/2)} + V_T) \qquad \text{Eqt. 4}$$

$$V_{gs20} = -(((I_a * 2 * L_{20})/(k'^* W_{20}))^{(1/2)} + V_T) \qquad \text{Eqt. 5}$$

where:

$V_{gs16}$ is the gate-to-source voltage of IGFET 16 operating in saturation mode;

$V_{gs18}$ is the gate-to-source voltage of IGFET 18 operating in saturation mode;

$V_{gs20}$ is the gate-to-source voltage of IGFET 20 operating in saturation mode;

$I_a$ is the current sourced by current source 22;

$I_b$ is the current sourced by current source 24;

$L_{16}$, $L_{18}$, and $L_{20}$ are the lengths of P-channel IGFETs 16, 18, and 20, respectively;

$W_{16}$, $W_{18}$, and $W_{20}$ are the widths of P-channel IGFETs 16, 18, and 20, respectively;

$V_T$ is the threshold voltage of P-channel IGFETs 16, 18, and 20, respectively; and k' is the process transconductance parameter.

From Kirchoff's Voltage Law:

$$V_{gs26} = V_{REF} - V_{gs20} + V_{gs18} + V_{gs16} - V_{DD} \qquad \text{Eqt. 6}$$

Substituting Equations 3-5 into Equation 6 and rearranging the terms yields Equation 7:

$$V_{gs26} = V_{REF} - V_T - V_{DD} - V_X \qquad \text{Eqt. 7}$$

where:

$$V_X = ((I_a * 2 * L_{20})/(k'^* W_{20}))^{(1/2)} + ((I_b * 2 * L_{18})/(k'^* W_{18}))^{(1/2)} + ((I_b * 2 * L_{16})/(k'^* W_{16}))^{(1/2)}$$

Equation 2 is derived by setting $V_X$ equal to zero. In accordance with one embodiment, $V_X$ is set to zero by setting:

$$I_a = 4 * I_b;$$

$$W_{16} = W_{18} = W_{20}; \text{ and}$$

$$L_{16} = L_{18} = L_{20}.$$

In accordance with another embodiment, $V_X$ is set to zero by setting:

$$L_{20} = 4 * L_{16} = 4 * L_{18};$$

$$W_{16} = W_{18} = W_{20}; \text{ and}$$

$$I_a = I_b.$$

P-channel IGFET 26 having a gate-to-source voltage $V_{gs26}$ generates a drain current $I_{D26}$ given by Equation 8:

$$I_{D26} = k'^* (W_{26}/L_{26}) * (0.5) * (V_{gs26} - V_T)^2 (1 + \lambda * V_{ds26}) \qquad \text{Eqt. 8}$$

where:

k' is the process transconductance parameter;

$W_{26}$ is the width of P-channel IGFET 26;

$L_{26}$ is the length of P-channel IGFET 26;

$V_{gs26}$ is the gate-to-source voltage of P-channel IGFET 26;

$V_{ds26}$ is the drain-to-source voltage of P-channel IGFET 26; and $\lambda$ is the channel-length modulation parameter.

The channel length modulation parameter $\lambda$ is typically very small and therefore the parameter $(1+\lambda * V_{ds26})$ can be ignored. Under this condition, the drain current $I_{D26}$ becomes:

$$I_{D26} = k'^* (W_{26}/L_{26}) * (0.5) * (V_{gs26} - V_T)^2 \qquad \text{Eqt. 9}$$

Substituting Eqt. 2 into Eqt. 9 gives a drain current that is proportional to the process transconductance parameter k' as given be Equation 10:

$$I_{D26} = k'^* (W_{26}/L_{26}) * (0.5) * (V_{REF} - V_{DD})^2 \qquad \text{Eqt. 10}$$

Thus, P-channel IGFET 26 serves as a current source for comparator 14 that generates a drain current $I_{D26}$ that is proportional to the process transconductance parameter k'.

Comparator 14 includes a differential input stage comprising P-channel IGFETs 28 and 30 and uses two feedback paths to provide hysteresis. Preferably, the feedback paths are positive feedback paths. The hysteresis, $V_{hyst}$, is determined using Equation 10 and the assumption that comparator 14 has already switched:

$$V_{hyst} = V_{gs30} - V_{gs28} \quad \text{Eqt. 11}$$

where:

$V_{gs28}$ is the gate-to-source voltage of P-channel IGFET 28; and $V_{gs30}$ is the gate-to-source voltage of P-channel IGFET 30.

Gate-to-source voltages $V_{GS28}$ and $V_{GS30}$ for transistors 28 and 30, respectively, are given by Equations 12 and 13, respectively:

$$V_{gs28} = -(((I_{D28}*2*L_{28})/(k'*W_{28}))^{(1/2)} + V_T) \quad \text{Eqt. 12}$$

$$V_{gs30} = -(((I_{D30}*2*L_{30})/(k'*W_{30}))^{(1/2)} + V_T) \quad \text{Eqt. 13}$$

where:

$I_{D28}$ and $I_{D30}$ are the drain currents flowing through P-channel IGFETs 28 and 30, respectively;

$L_{28}$ and $L_{30}$ are the channel lengths of P-channel IGFETs 28 and 30, respectively;

$W_{28}$ and $W_{30}$ are the channel widths of P-channel IGFETs 28 and 30, respectively;

$V_T$ is the threshold voltage for P-channel IGFETs 28 and 30, respectively; and k' is the process transconductance parameter.

Currents $I_{D28}$ and $I_{D30}$ can be expressed in terms of drain current $I_{D26}$ using Equations 14 and 15, respectively:

$$I_{D28} = I_{D26}/(1+N) \quad \text{Eqt. 14}$$

$$I_{D30} = N*I_{D26}/(1+N) \quad \text{Eqt. 15}$$

where:

$$N = (W_{38}/L_{38})/(W_{36}/L_{36}) = (W_{40}/L_{40})/(W_{42}/L_{42}) \quad \text{Eqt. 16}$$

Substituting Equation 16 into Equations 14 and 15 yields substituted Equations 14 and 15 which are then substituted into Equations 11 and 12, respectively, to yield Equation 17, i.e., an equation for hysteresis voltage $V_{hyst}$:

$$\begin{aligned}V_{hyst} &= V_{gs30} - V_{gs28} \\ &= ((I_{D26}*2*L_{30})/(k'*W_{30}*(1+N)))^{1/2} - \\ &\quad ((I_{D26}*2*L_{28}*N)/(k'*W_{28}*(1+N)))^{1/2}\end{aligned} \quad \text{Eqt. 17}$$

Setting $A = (W_{26}/L_{26})/(W_{28}/L_{28})$, setting $(W_{28}/L_{28}) = (W_{30}/L_{30})$, substituting these values into Equation 17, and rearranging the equation yields the hysteresis voltage $V_{hyst}$ as given by Equation 18:

$$V_{hyst} = ((N/(1+N))^{1/2} - (1/(1+N))^{1/2})*(V_{REF} - V_{DD})*(A)^{1/2} \quad \text{Eqt. 18}$$

Thus, a comparator has been provided having hysteresis that is independent of the process transconductance parameters of the transistors making up the comparator and, therefore, independent of temperature. In accordance with this embodiment, the hysteresis voltage is dependent upon the ratios of the lengths and widths of the IGFETs and reference voltage $V_{REF}$. An advantage of the present invention is that transistor parameters such as lengths and widths can be well controlled and therefore parameters or characteristics such as hysteresis can also be well controlled.

Figure 2:
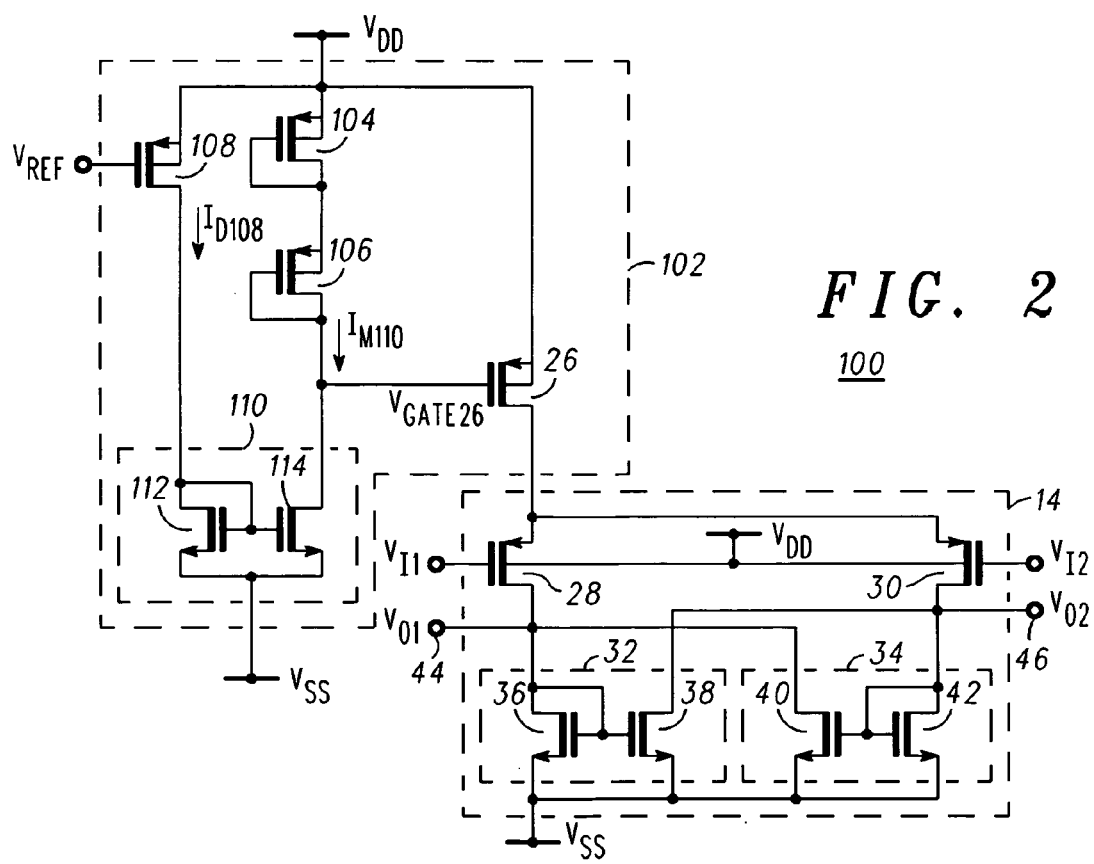
FIG. 2 is a schematic diagram of an electronic circuit in accordance with another embodiment of the present invention.

FIG. 2 is a schematic diagram of an electronic circuit 100 comprising a reference generator 102 connected to comparator 14 in accordance with another embodiment of the present invention. Reference generator 102 comprises two diode connected P-channel IGFETs 104 and 106, a P-channel (IGFET) 108, P-channel IGFET 26, and a current mirror 110. More particularly, the source of P-channel IGFET 104 is coupled for receiving source of operating potential $V_{DD}$, the gate of P-channel IGFET 104 is connected to its drain, and the body of P-channel IGFET 104 is connected to its source. The drain of P-channel IGFET 104 is connected to the source of P-channel IGFET 106 and the gate of P-channel IGFET 106 is connected to its drain. The body of P-channel IGFET 106 is connected to its source and the drain of P-channel IGFET 106 is connected to current mirror 110. The source of P-channel IGFET 108 is connected to its body and for receiving source of operating potential $V_{DD}$. The gate of P-channel IGFET 108 is coupled for receiving a reference voltage $V_{REF}$ and the drain of P-channel IGFET 108 is connected to current mirror 110. The drain of P-channel IGFET 106 is connected to the gate of P-channel IGFET 26.

Current mirror 110 comprises a pair of N-channel IGFETs 112 and 114. The drain of N-channel IGFET 112 is connected to the drain of P-channel IGFET 108, the source of N-channel IGFET 112 is coupled to the source of N-channel IGFET 114 and for receiving source of operating potential $V_{SS}$. The gates of N-channel IGFETs 112 and 114 are commonly connected to each other and to the drains of P-channel IGFET 108 and N-channel IGFET 112. The drain of N-channel IGFET 114 is connected to the drain of P-channel IGFET 106 and to the gate of P-channel IGFET 26. The commonly connected gate and drain of N-channel IGFET 112 may be referred to as an input terminal of current mirror 110 and the drain of N-channel IGFET 114 may be referred to as a mirror or output terminal of current mirror 110.

In operation, a reference voltage $V_{REF}$ is applied to the drain of P-channel IGFET 108, causing a current $I_{D108}$ to flow. Current mirror 110 mirrors current $I_{D108}$ such that P-channel IGFETs 104 and 106 operate in saturation mode and a current $I_{M110}$ flows through IGFETs 104, 106, and 114. In response to current $I_{M110}$, a voltage $V_{GATE26}$ appears at the gate of P-channel IGFET 26 such that it operates in saturation mode. Gate voltage $V_{GATE26}$ is given by Equation 19 (Eqt. 19) as:

$$V_{GATE26} = V_{REF} - V_T \quad \text{Eqt. 19}$$

where:

$V_{REF}$ is the reference voltage applied at the gate of P-channel IGFET 108; and $V_T$ is the threshold voltage of P-channel IFGETs 104, 106, and 108.

Thus, P-channel IGFET 26 has a gate-to-source voltage $V_{gs26}$ given by Equation 20 (Eqt. 20) as:

$$V_{gs26} = V_{REF} - V_T - V_{DD} \quad \text{Eqt. 20}$$

where:

$V_{REF}$ is the reference voltage applied at the gate of P-channel IGFET 108;

$V_T$ is the threshold voltage of P-channel IGFETs 104, 106, 108, and 26; and $V_{DD}$ is a source of operating potential.

Equation 20 is derived using Kirchoff's Voltage Law and the equations for the gate-to-source voltages of P-channel IGFETs 104, 106, 108, and 26. The gate-to-source voltages of P-channel IGFETs 104, 106, 108, and 26 are given by Equations 21, 22, 23, and 24, respectively, as:

$$V_{gs104} = -(((I_{M110} * 2 * L_{104})/(k'*W_{104}))^{(1/2)} + V_T) \quad \text{Eqt. 21}$$

$$V_{gs106} = -(((I_{M110} * 2 * L_{106})/(k'*W_{106}))^{(1/2)} + V_T) \quad \text{Eqt. 22}$$

$$V_{gs108} = -(((I_{D108} * 2 * L_{108})/(k'*W_{108}))^{(1/2)} + V_T) \quad \text{Eqt. 23}$$

$$V_{gs26} = -(((I_{D26} * 2 * L_{26})/(k'*W_{26}))^{(1/2)} + V_T) \quad \text{Eqt. 24}$$

where:

$V_{gs104}$ is the gate-to-source voltage of IGFET 104 operating in saturation mode;

$V_{gs106}$ is the gate-to-source voltage of IGFET 106 operating in saturation mode;

$V_{gs108}$ is the gate-to-source voltage of IGFET 108 operating in saturation mode;

$V_{gs26}$ is the gate-to-source voltage of IGFET 26 operating in saturation mode;

$I_{D108}$ is the drain current of IGFET 108 operating in saturation mode;

$I_{M110}$ is the drain current of IGFETs 104, 106, and 114, i.e., it is a mirrored current;

$L_{104}$, $L_{106}$, $L_{108}$, and $L_{26}$ are the lengths of P-channel IGFETs 104, 106, 108, and 26, respectively;

$W_{104}$, $W_{106}$, $W_{108}$, and $W_{26}$ are the widths of P-channel IGFETs 104, 106, 108, and 26, respectively;

$V_T$ is the threshold voltage of P-channel IGFETs 104, 106, 108, and 26; and k' is the process transconductance parameter.

From Kirchoff's Voltage Law:

$$V_{gs26} = V_{REF} - V_{gs108} + V_{gs104} + V_{gs106} - V_{DD} \quad \text{Eqt. 25}$$

Substituting Equations 21-24 into Equation 25 and rearranging the terms yields Equation 26:

$$V_{gs26} = V_{REF} - V_T - V_{DD} - V_Z \quad \text{Eqt. 26}$$

where:

$V_Z = ((I_{D108} * 2 * L_{108})/(k'*W_{108}))^{(1/2)} - ((I_{M110} * 2 * L_{104})/(k'*W_{104}))^{(1/2)} - ((I_{M110} * 2 * L_{106})/(k'*W_{106}))^{(1/2)}$

Equation 20 is derived by setting voltage $V_Z$ equal to zero. In accordance with one embodiment, $V_Z$ is set to zero by setting:

$I_{M110} = 4 * I_{D108}$;

$W_{104} = W_{106} = W_{108}$; and $L_{104} = L_{106} = L_{108}$.

In accordance with another embodiment, $V_Z$ is set to zero by setting:

$L_{104} = L_{106} = 4 * L_{108}$;

$W_{104} = W_{106} = W_{108}$; and $I_{D108} = I_{M110}$.

Like the embodiment shown in FIG. 1, P-channel IGFET 26 generates a drain current $I_{D26}$ given by Equation 8 and comparator 14 has a hysteresis voltage, $V_{hyst}$, given by Equation 18.

Figure 3:
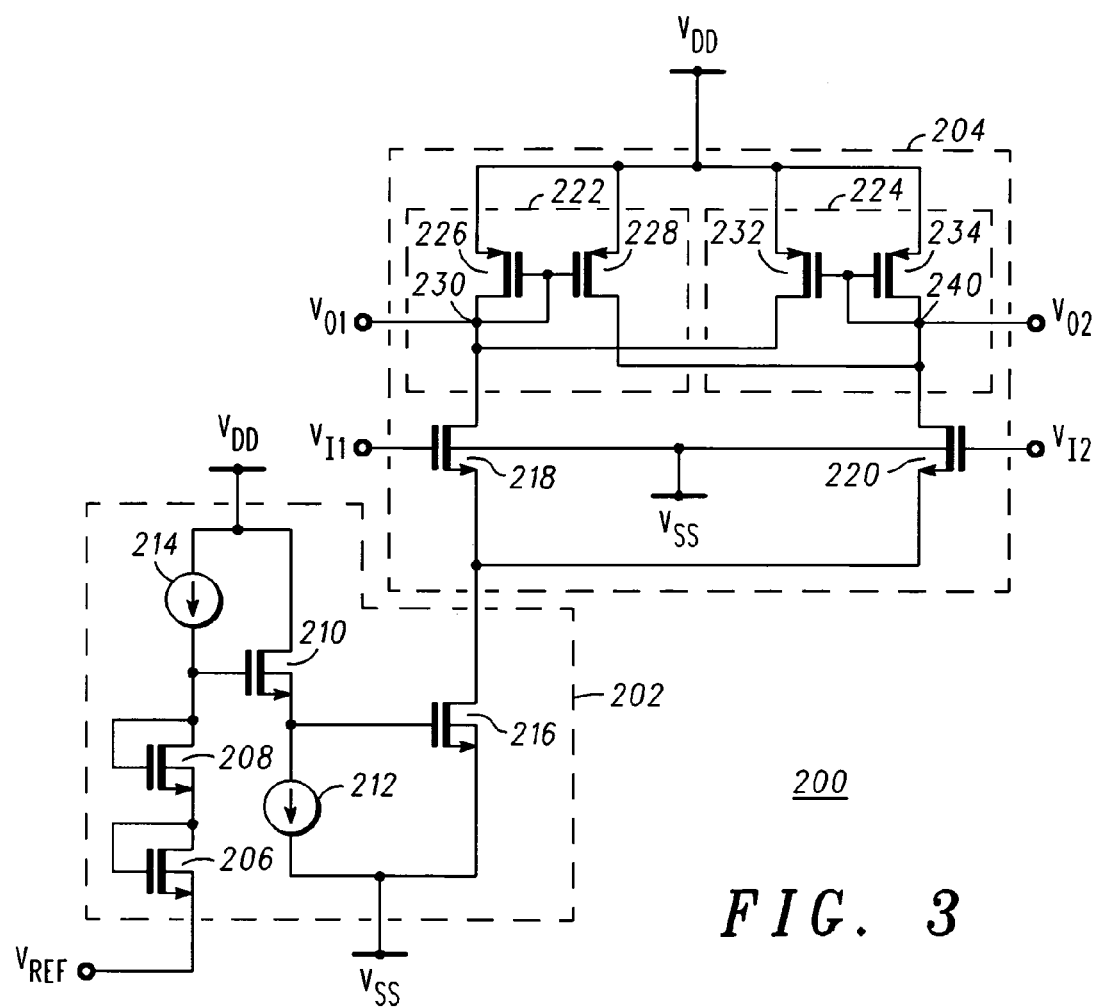
FIG. 3 is a schematic diagram of an electronic circuit in accordance with yet another embodiment of the present invention.

FIG. 3 is a schematic diagram of an electronic circuit 200 comprising a reference generator 202 connected to a comparator 204 in accordance with another embodiment of the present invention. Reference generator 202 comprises two diode connected N-channel IGFETs 206 and 208, an N-channel IGFET 210, an N-channel IGFET 216, and two current sources 212 and 214. More particularly, the source of N-channel IGFET 206 is coupled for receiving reference voltage $V_{REF}$ and the gate of N-channel IGFET 206 is connected to its drain. The body of N-channel IGFET 206 is connected to its source. The drain of N-channel IGFET 206 is connected to the source of N-channel IGFET 208. The body of N-channel IGFET 208 is connected to its source and the gate of N-channel IGFET 208 is connected to its drain. The gate of N-channel IGFET 210 is connected to the gate and drain of N-channel IGFET 208, the source on N-channel IGFET 210 is coupled for receiving a source of operating potential $V_{SS}$ through current source 212, and the drain of N-channel IGFET 210 is coupled for receiving a source of operating potential $V_{DD}$. The body of N-channel IGFET 210 is connected to its source. In addition, the gate of N-channel IGFET 210 and the drain of N-channel IGFET 208 are coupled for receiving the source of operating potential $V_{DD}$ through a current source 214.

N-channel IGFET 216 has a gate connected to the source of N-channel IGFET 210 and to current source 212, a source connected for receiving source of operating potential $V_{DD}$, and a body connected to its source.

Comparator 204 comprises a pair of differentially configured N-channel IGFETs 218 and 220 and a pair of current mirrors 222 and 224. The sources of P-channel IGFETs 218 and 220 are commonly connected to each other and to the drain of IGFET 216. The gates of IGFETs 218 and 220 are coupled for receiving input signals $V_{I1}$ and $V_{I2}$, respectively. The bodies of IGFETs 218 and 220 are coupled for receiving source of operating potential $V_{SS}$. Current mirror 222 comprises a pair of P-channel IGFETs 226 and 228 having commonly connected gates and commonly connected sources, which commonly connected sources are coupled for receiving source of operating potential $V_{DD}$. The commonly connected gates of P-channel IGFETs 226 and 228 are connected to the drains of N-channel IGFET 218 and P-channel IGFET 226. Thus, the drain of N-channel IGFET 218 is connected to the drain of P-channel IGFET 226. The commonly connected drains of IGFETs 218 and 226 serve as an output 230 of comparator 214 for outputting an output signal $V_{O1}$. The drain of P-channel transistor 228 is connected to the drains of N-channel IGFET 220 and P-channel IGFET 234.

Current mirror 224 comprises a pair of P-channel IGFETs 232 and 234 having commonly connected gates and commonly connected sources, which sources are coupled for receiving source of operating potential $V_{DD}$. The commonly connected gates of N-channel IGFETs 232 and 234 are connected to the drains of N-channel IGFET 220 and P-channel IGFET 234. The drain of N-channel IGFET 220 is connected to the drain of P-channel IGFET 234 and serves as an output 240 of comparator 14 for outputting an output signal $V_{O2}$. The drains of N-channel IGFET 220 and P-channel IGFET 234 are also connected to the drain of P-channel transistor 228.

The operation of electronic circuit 200 is similar to that of electronic circuits 10 and 100 except the equations are modified to account for the P-channel IGFETs of electronic circuit 10 that have been switched to N-channel IGFETs and for the N-channel IGFETs that have been switched to P-channel IGFETs.

By now it should be appreciated that a circuit and method for generating a voltage dependent on the threshold voltage of an IGFET and for generating a drain current proportional to a process transconductance parameter have been provided. Because of the dependence on threshold voltage, the circuit can be used in combination with other circuits to generate electrical signals that are independent of temperature. Although, the generation and use of a current proportional to the process transconductance parameter in conjunction with a comparator has been shown, this is not a limitation of the present invention. Temperature effects associated with other circuits can also be negated or nullified.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for nullifying temperature dependence associated with a transconductance, comprising:
   generating a first current that is proportional to a first transconductance and that is substantially independent of the threshold voltage of a first insulated gate field effect transistor; and
   using the first current to generate an output that is substantially independent of the first transconductance.

2. The method of claim 1, wherein generating the first current includes applying a voltage to a gate of the first insulated gate field effect transistor, the voltage having a threshold voltage component from a second insulated gate field effect transistor.

3. The method of claim 2, wherein generating the first current includes using means for generating the voltage, wherein the voltage is a difference between a reference voltage and the threshold voltage component from the second insulated gate field effect transistor.

4. A method for nullifying temperature dependence associated with a transconductance, comprising:
   generating a first current that is proportional to first transconductance; and
   using the first current to generate an output that is substantially independent of the first transconductance by:
   providing a second insulated gate field effect transistor having a second transconductance; and
   using the second insulated gate field effect transistor and a portion of the first current to nullify the temperature effect of the first transconductance parameter.

5. The method of claim 4, wherein using the second insulated gate field effect transistor and the portion of the first current to nullify the temperature effect of the first transconductance parameter includes rationing the first and second transconductance parameters to generate a first constant.

6. The method of claim 4, further including:
   providing a third insulated gate field effect transistor having a third device transconductance parameter; and
   using the third insulated gate field effect transistor and another portion of the first current to nullify the temperature effect of the first transconductance parameter.

7. A method for negating a temperature component of an electrical signal, comprising:
   generating a current that is proportional to a first process transconductance parameter, wherein generating the current includes applying a second voltage to a gate of first insulated gate field effect transistor, the second voltage having a component substantially equal to a threshold voltage of the first insulated gate field effect transistor; and
   using a portion of the current to generate a first voltage, wherein the first voltage includes a component having a second process transconductance parameter, and wherein a ratio of the first process transconductance parameter to the second process transconductance parameter is substantially constant and substantially independent of temperature.

8. The method of claim 7, further including generating the second voltage to include a term that is one of a sum of a reference voltage and threshold voltage of a second insulated gate field effect transistor or a difference between the reference voltage and the threshold voltage of the second insulated gate field effect transistor and using another portion of the current to generate a third voltage, wherein the third voltage has as third process transconductance parameter, and wherein a ratio of the first process transconductance parameter to the third transconductance component is substantially constant and substantially independent of temperature.

9. A method for nullifying a temperature dependence of a characteristic associated with a circuit, comprising:
   generating a first current having a first transconductance value;
   supplying the first current to the circuit whose output is dependent on temperature and its transconductance, the circuit having a characteristic and a second transconductance, wherein the characteristic of the circuit is substantially independent of temperature.

10. The method of claim 9, wherein the characteristic is a measurable characteristic.

11. The method of claim 10, wherein the measurable characteristic is hysteresis.

12. The method of claim 9, wherein the circuit comprises a comparator.

13. The method of claim 9, further including taking a ratio of the first transconductance to the second transconductance to nullify the temperature dependence of the characteristic.

14. A circuit, comprising:
   a conductor for transmitting a current proportional to a first process transconductance parameter;
   a circuit coupled to the conductor, wherein the circuit cooperates with the conductor to negate a temperature component of an output signal, further including:
   a first semiconductor device having first and second current carrying electrodes;
   a second semiconductor device having first and second current carrying electrodes, the first current carrying electrode of the second semiconductor device coupled to the second current carrying electrode of the first semiconductor device;
   a third semiconductor device having a control electrode and first and second current carrying electrodes, the control electrode coupled to the second current carrying electrode of the second semiconductor device;
   a first current source coupled between the second current carrying electrode of the second semiconductor device and a first source of operating potential; and
   a second current source coupled between the first current carrying electrode of the third semiconductor device and a second source of operating potential.

15. The circuit of claim 14, wherein the first, second, and third semiconductor devices are P-channel insulated gate field effect transistors.

16. The circuit of claim 14, further including a fourth semiconductor device having a control electrode and first and second current carrying electrodes, the control electrode coupled to the first current carrying electrode of the third semiconductor device, the first current carrying electrode coupled for receiving a source of operating potential, and the second current carrying electrode serving as the conductor for transmitting a current proportional to a first process transconductance parameter.

17. The circuit of claim 16, wherein the circuit comprises a comparator.

18. The circuit of claim 17, wherein the comparator comprises:
- a fifth semiconductor device having a control electrode, first and second current carrying electrodes, and a body region, the first current carrying electrode of the fifth semiconductor device coupled to the conductor for transmitting a current proportional to a first process transconductance parameter;
- a sixth semiconductor device having a control electrode, first and second current carrying electrodes, and a body region, the first current carrying electrode of the sixth semiconductor device coupled to the conductor for transmitting a current proportional to a first process transconductance parameter;
- a first current mirror having an input terminal and a mirror terminal, the input terminal coupled to the second current carrying electrode of the fifth semiconductor device and the mirror terminal coupled to the second current carrying electrode of the sixth semiconductor device; and
- a second current mirror having an input terminal and a mirror terminal, the input terminal coupled to the second current carrying electrode of the sixth semiconductor device and the mirror terminal coupled to the second current carrying electrode of the fifth semiconductor device.

19. A circuit, comprising:
- a conductor for transmitting a current proportional to a first process transconductance parameter;
- a circuit coupled to the conductor, wherein the circuit cooperates with the conductor to negate a temperature component of an output signal;
- a first semiconductor device having first a control electrode and first and second current carrying electrodes, the control electrode coupled to the second current carrying electrode, the first current carrying electrode coupled for receiving a first source of operating potential;
- a second semiconductor device having a control electrode and first and second current carrying electrodes, the control electrode of the second semiconductor device coupled to its second current carrying electrode, the first current carrying electrode of the second semiconductor device coupled to the second current carrying electrode of the first semiconductor device;
- a third semiconductor device having a control electrode and first and second current carrying electrodes, the control electrode coupled to the second current carrying electrode of the second semiconductor device, the first current carrying electrode coupled for receiving the source of operating potential, and the second current carrying electrode serving as the conductor for transmitting the current proportional to the first process transconductance parameter;
- a fourth semiconductor device having a control electrode and first and second current carrying electrodes, the first current carrying electrode coupled for receiving a source of operating potential and the control electrode coupled for receiving a reference potential; and
- a first current mirror having an input and an output, the second current carrying electrode of the fourth semiconductor device coupled to the input of the current mirror and the second current carrying electrode of the second semiconductor device coupled to the output of the current mirror.

20. The circuit of claim 19, wherein the circuit comprises a comparator.

21. The circuit of claim 20, wherein the comparator comprises:
- a fifth semiconductor device having a control electrode, first and second current carrying electrodes, and a body region, the first current carrying electrode of the fifth semiconductor device coupled to the conductor for transmitting a current proportional to a first process transconductance parameter;
- a sixth semiconductor device having a control electrode, first and second current carrying electrodes, and a body region, the first current carrying electrode of the sixth semiconductor device coupled to the conductor for transmitting a current proportional to a first process transductance parameter;
- a second current mirror having an input terminal and a mirror terminal, the input terminal coupled to the second current carrying electrode of the fifth semiconductor device and the mirror terminal coupled to the second current carrying electrode of the sixth semiconductor device; and
- a third current mirror having an input terminal and mirror terminal, the input terminal coupled to the second current carrying electrode of the sixth semiconductor device and the mirror terminal coupled to the second current carrying electrode of the fifth semiconductor device.

* * * * *